(12) United States Patent
Engle et al.

(10) Patent No.: US 6,535,694 B2
(45) Date of Patent: Mar. 18, 2003

(54) FINGER ACTUATED DEVICE HAVING A PROXIMITY DETECTOR

(75) Inventors: Joseph Craig Engle, Carmel, IN (US); John Herbert Stevens, Martinsville, IN (US)

(73) Assignee: Thomson Licensing S.A., Boulogne, Cedex (FR)

( * ) Notice: Subject to any disclaimer, the term of this patent is extended or adjusted under 35 U.S.C. 154(b) by 0 days.

(21) Appl. No.: 09/781,506

(22) Filed: Feb. 12, 2001

(65) Prior Publication Data

US 2002/0110373 A1 Aug. 15, 2002

(51) Int. Cl.[7] .................. G03B 17/00; G08B 21/00; G01R 27/26
(52) U.S. Cl. .................. 396/263; 396/542; 331/65; 250/221; 324/656; 324/658
(58) Field of Search .................. 396/263, 542, 396/543, 301, 302; 324/658, 656, 654, 647, 382, 310, 315, 364; 250/208.2, 221, 227.22, 559.29, 559.31, 559.32; 331/65, 67

(56) References Cited

U.S. PATENT DOCUMENTS

| 5,103,085 A | * | 4/1992 | Zimmerman | 250/221 |
| 5,923,908 A | * | 7/1999 | Schrock et al. | 396/85 |
| 5,973,318 A | * | 10/1999 | Plesko | 250/227.22 |

* cited by examiner

Primary Examiner—David M. Gray
Assistant Examiner—Rochelle Blackman
(74) Attorney, Agent, or Firm—Joseph S. Tripoli; Joseph J. Laks; Ronald H. Kurdyla

(57) ABSTRACT

The present invention is a button on a device that has the ability to detect when a finger touches or is proximate to the button, especially to cause the initiation of a particular feature/function of the device. The button includes a proximity detector that is operable to sense or detect when a user's finger is proximate or on the button. The proximity detector may take many forms. These forms may be combined to provide greater selectivity. Additionally, sensitivity of the proximity detector may be set via threshold values. Sensitivity of the proximity detector correlates to detection or sensing of a user's finger at various distances from the button. One application is as an autofocus/shutter button on a camera.

17 Claims, 6 Drawing Sheets

FINGER ACTUATED DEVICE HAVING A PROXIMITY DETECTOR

FIELD OF THE INVENTION

The present invention relates to devices that are actuated by a finger actuator and, more particularly, to a method and apparatus for sensing when a finger is proximate an actuator.

BACKGROUND OF THE INVENTION

Certain devices are equipped with actuators typically in the form of a button or button-like object. When a user presses the button, a particular feature or function is initiated for the particular device. One such device is a camera. A camera has a shutter button which, when pressed, opens the shutter of the camera to take a picture. Cameras such as camcorders likewise have a "shutter" button that, when pressed, starts recording.

Today, many cameras have an autofocus feature or function that automatically focuses the camera before a picture is taken or recording commences. Typical initiation of the autofocus feature/function is accomplished when a user partially depresses the shutter of the camera. However, some cameras have no detent or mechanism for recognizing when a "partial press" has been accomplished, as required for initiation of the autofocus feature/function. In this case, the user is unsure of when the partial press for autofocus has occurred (been engaged). Thus, there is a problem of users accidentally taking a picture when the user is only trying to cause the autofocus feature to engage. Autofocus, however, needs to be performed just before a picture is taken or recording commences. Further, autofocus should be accomplished without requiring the user to perform any more steps than necessary.

It is thus an object of the present invention to provide an improved manner and/or mechanism of initiating autofocus in a camera.

SUMMARY OF THE INVENTION

The present invention is a proximity detector for an actuator in a device. More particularly, the present invention is a proximity detector for a camera button that initiates an autofocus feature/function of the camera.

In one form, the present invention is an electronic apparatus having a processing unit, an actuator in communication with the processing unit, and a proximity detector associated with the actuator and in communication with the processing unit. The actuator is operable upon actuation thereof to activate a first function of the electronic apparatus. The proximity detector is operable to detect when a finger of a user is proximate the actuator and initiate a second function of the electronic apparatus.

In another form, the present invention is a camera including a controller, a shutter button in communication with the controller, and a proximity detector associated with the shutter button and in communication with the controller. The shutter button is operable to activate a shutter of the camera. The proximity detector is operable to sense when a finger of a user is proximate the shutter button in order to initiate an autofocus feature.

In a yet further form, the present invention is a camera including a controller, an actuator in communication with the controller and operable to initiate a first function of the camera, means for detecting when a finger of a user is proximate the actuator, and means for initiating an autofocus feature of the camera when the finger of the user is detected in proximity to the actuator.

BRIEF DESCRIPTION OF THE DRAWINGS

Reference to the following description of the present invention should be taken in conjunction with the accompanying drawings, wherein.

Corresponding reference characters indicate corresponding parts throughout the several views.

DETAILED DESCRIPTION OF THE INVENTION

Figure 1:
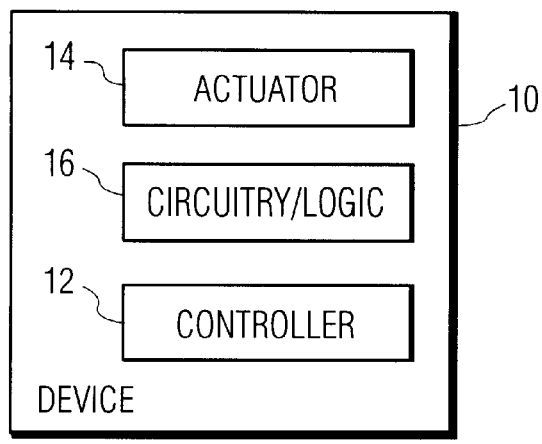
FIG. 1 is a block representation of a generic device in which the present invention may be implemented.

With reference to FIG. 1, there is depicted a portion of a device, generally designated 10, that utilizes an actuator 14 to perform a function. It should be appreciated that the device 10 and its actuator 14 are only exemplary of an actuator of an exemplary device. Thus, while the present invention is discussed below with particular reference to a camera (device) and, more particularly, to an autofocus shutter button (actuator) on a camera, the present invention is applicable to all types of similar actuators and/or devices. The camera itself may be any type of camera such as a still camera (analog/film and/or digital), a camcorder (analog/film and/or digital), or a combination of both.

In FIG. 1, the device 10 includes the actuator 14, a controller 12, and appropriate circuitry/logic 16. The actuator 14 may be a button, a switch, or the like that controls a particular feature or function of the device 10. The device 10 is under control by the controller 12 and includes the appropriate circuitry/logic 16 as is necessary to carry out the various functions and/or features presented herein as well as any other features and/or functions of the particular device 10. The controller 12 may be a microprocessor, microcontroller, processing unit, other similarly functioning circuitry/logic, or the like, and is in communication with the actuator 14 and the circuitry/logic 16.

Figure 2:
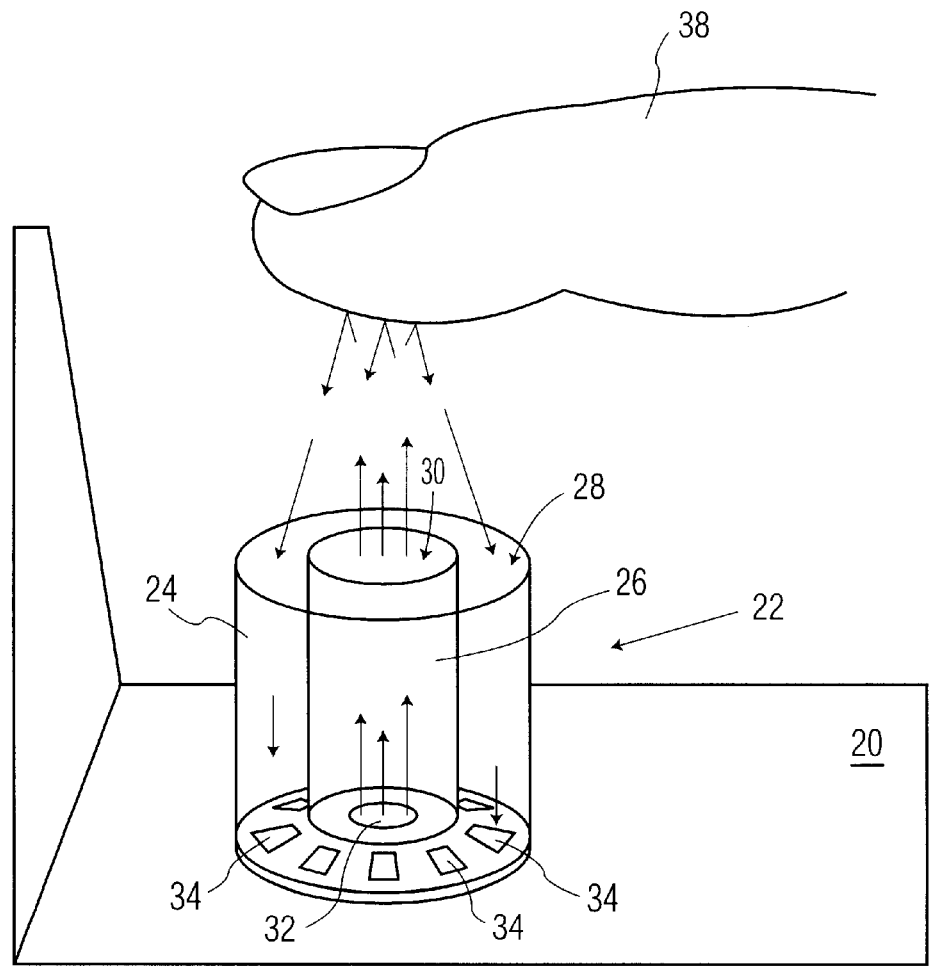
FIG. 2 is an enlarged perspective view of an actuator of a camera incorporating an embodiment of the present invention.

In general terms, the actuator 14 is operable to initiate (or end) a function and/or feature of the device 10. The actuator 14 may take many forms and be implemented in a variety of ways. In the case of the device 10 being a camera, the actuator 14 may be a shutter button for taking a picture. More particularly, the actuator 14 may be a combination shutter/autofocus initiation button in accordance with the principles of the present invention. It should thus be appreciated that while the present invention is applicable to various devices as set forth herein, the present invention will be particularly described in connection with a camera. More particularly, the camera has a combination shutter/autofocus button. The shutter/autofocus button is operable, as described below, to initiate/actuate an autofocus feature/function of the camera before a picture is taken. The shutter/autofocus button also actuates the camera's shutter. It should be appreciated that the present invention is applicable to many functions/features Referring now to FIG. 2, there is shown an embodiment of the present invention. In particular, there is depicted an actuator 22 (e.g. a shutter/autofocus button) of a camera 20. It should be appreciated that only a portion of the housing of the camera 20 is shown. The actuator 22 is operable to be depressed by a user, represented in FIG. 2 by a user's finger 38, in order to take a picture. Preferably, the actuator 22 is normally biased into a non-depressed position as depicted in FIG. 2. The actuator 22 includes a first or outer cylinder or tube 24 and a second or inner cylinder or tube 26. The inner cylinder 26 is preferably, but not necessarily, coaxial and/or concentric with the outer cylinder 24 such that an annular space or cavity 28 is defined therebetween. The outer and inner cylinders 24 and 26 are fabricated from a suitable material such as is known in the art.

A light source 32 is located at the bottom of the inner cylinder 26. The light source may be an LED or the like that projects or shines light upwards through the cavity 30 defined by the inner cylinder 26. The light may be a particular wavelength or frequency, a combination of wavelengths or frequencies, or of no particular wavelength or frequency. Located at the bottom of the cavity 28 between the inner cylinder and the outer cylinder 24 are preferably a plurality of photo or light sensors 34, each one of which is operable to detect the particular light from the light source 32. It should be appreciated that one or any number of photo sensors 34 may be used.

The photo sensors 34 are operable to receive light (represented by arrows entering into the cavity 28) from the light source 32 (represented by arrows emanating from the light source 32) that has been reflected from a finger 38 (represented by angled arrows adjacent the finger 38) of a user that is proximate to the actuator 22. The physical distance defining "proximity" to the actuator 22 depends on various factors such as: parameters of the photo sensors 34; threshold settings of the receiving circuitry/logic for the photo sensors 34; the number of photo sensors 34, and the like. In all cases though, the photo sensors 34 are operable to detect or receive light from the light source 32 (i.e. non-ambient light) as it is reflected from the finger 38 (i.e. reflected light). When the photo sensors 34 receive enough reflected light, a signal or indication of the finger's proximity to the actuator 22 is provided. In the present case, this signal starts the autofocus feature/function of the camera 20.

Figure 4:
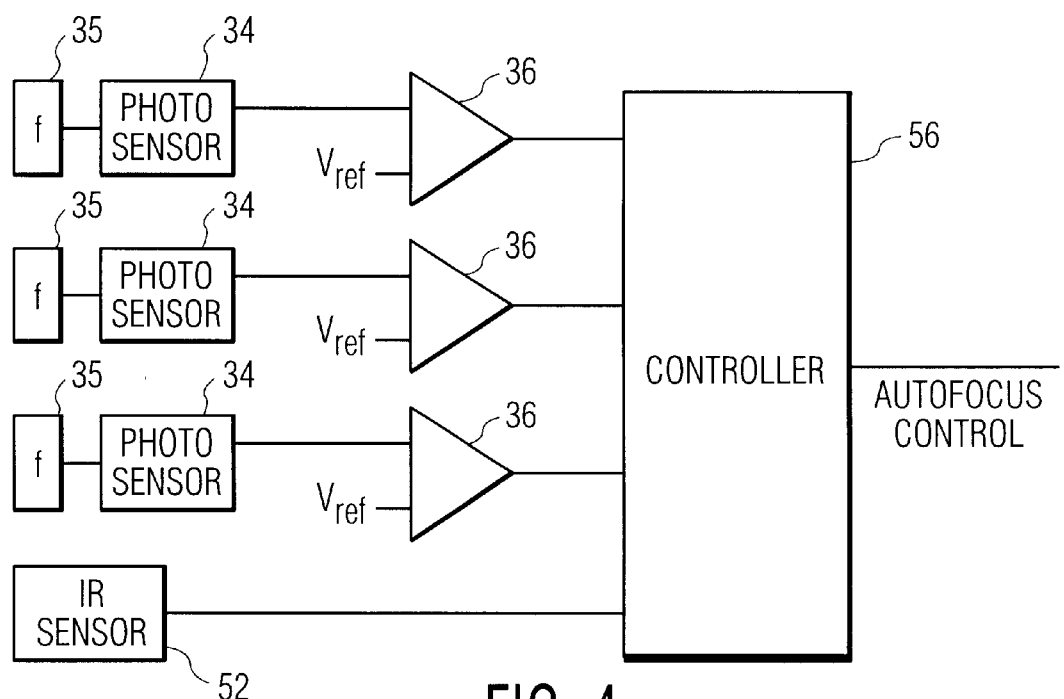
FIG. 4 is a schematic of an exemplary embodiment of circuitry/logic operable to implement the embodiments of the present invention depicted in FIGS. 2 and 3.

Referring to FIG. 4, there is shown a schematic of several of the photo sensors 34 coupled to (in electronic communication with) a controller 56 of the camera 20. Each photo sensor 34 is operable to provide a signal in response to the receipt of reflected light. Each photo is responsive to detect the wavelength or frequency of light emitted by the light source 32. Each photo sensor 34 may be covered by an optical filter 35 that is operable to filter ambient light from receipt by the photo sensor and/or provide only certain wavelengths of light to the photo sensor. Each optical filter preferably only allows the wavelength or frequency of light emitted by the light source 32 to pass therethrough before impinging on the respective photo sensor 34. As well, each filter may attenuate the light to some degree. Each photo sensor 34 is coupled to a comparator 36 such that the signal from each photo sensor 34 is received at one input of the respective comparator 36. Another input to each comparator 36 is coupled to a reference voltage Vref. The value of the reference voltage Vref defines a threshold value for the comparator 36 to utilize relative to or against the signal from the filter 35 or photo sensor 34. Thus, each comparator 36 is tied to a reference voltage Vref. The value of Vref may be different for each photo detector subsystem (i.e. a photo sensor, a comparator, and optionally an optical filter), or may be the same depending on design factors including, for example, the voltage of the wavelength of the light received by the photo sensor.

Each comparator 36 is operable to compare the signal from the respective photo sensor 34 against its respective reference voltage Vref. When the signal from the respective photo sensor 34 equals and/or exceeds the reference voltage Vref, the comparator 36 outputs an appropriate signal (indicating that the photo sensor signal has reach the threshold value) to the controller 56. The controller 56 utilizes the signal to determine what appropriate signal(s) if any are provided to the autofocus control line. When the signal from the respective photo sensor 34 is less than and/or equals the reference voltage Vref, the comparator 34 either does not output a signal to the controller 36 or an appropriate signal (indicating that the photo sensor signal has not reached a threshold value) is provided to the controller 56.

The reference voltage Vref or threshold value thus correlates to the proximity of the finger 38 to the actuator 22. The higher the reference voltage Vref (threshold value) the closer in proximity the finger 38 needs to be relative to 30 the actuator 22, such that more light must necessarily impinge or fall upon the photo sensor 34 to provide an actuation signal from the comparator 36 for initiation of the autofocus feature/function. The lower the reference voltage Vref (threshold value) the farther in proximity the finger 38 needs to be relative to the actuator 22, such that less light needs to impinge or fall upon the photo sensor 34 to provide an actuation signal from the comparator 36 for initiation of the autofocus feature/function.

In the case of one photo sensor 34, a signal indicating that the threshold value has been reached (i.e. that enough light has impinged upon the photo sensor 34, or the finger 38 is proximate enough the actuator 22) is sent to the controller 56 which utilizes the signal to provide an autofocus control signal via the autofocus control line to initiate the autofocus feature/function of the camera 20. In the case of multiple photo sensors 34, the controller 56 may use an algorithm for the various comparator signals to determine if an autofocus signal should be provided. Multiple photo sensors 34 improve the accuracy of detecting when a finger 38 is proximate the actuator 22.

Figure 3:
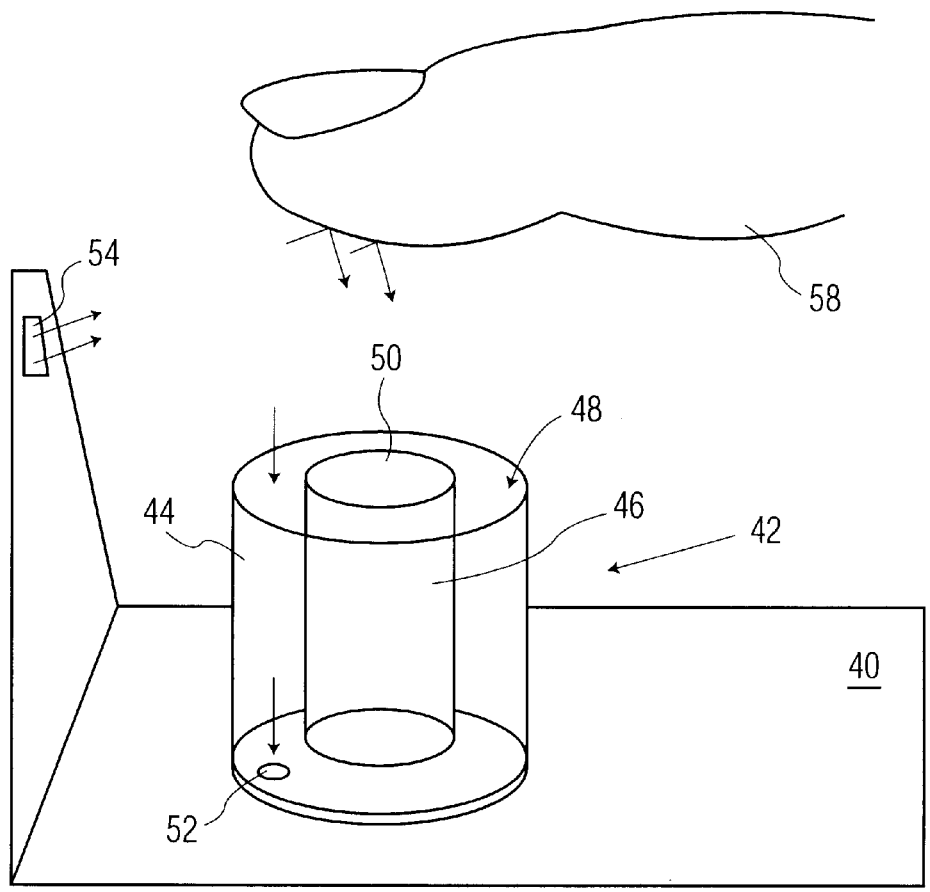
FIG. 3 is an enlarged perspective view of an actuator of a camera incorporating another embodiment of the present invention.

Referring now to FIG. 3, there is shown another embodiment of the present invention. In particular, there is depicted an actuator 42 (e.g. a shutter/autofocus button) of a camera 40. It should be appreciated that only a portion of the housing of the camera 40 is shown. The actuator 42 is operable to be depressed by a user, represented in FIG. 3 by a user's finger 58, in order to take a picture. Preferably, the actuator 42 is normally biased into a non-depressed position as depicted in FIG. 3. The actuator 42 includes a first or outer cylinder or tube 44 and a second or inner cylinder or tube 46. The inner cylinder 46 is preferably, but not necessarily, coaxial and/or concentric with the outer cylinder 44 such that an annular space or cavity 48 is defined therebetween. The outer and inner cylinders 44 and 46 are fabricated from a suitable material such as is known in the art.

The camera 40 includes an Infrared (IR) emitter or transmitter 54 that is operable to produce/generate and emit/transmit infrared signals, represented by arrows emanating from the IR emitter 54. The IR emitter 54 is typically mounted onto a viewfinder or body of the camera 40. An IR receiver or sensor 52 is located at the bottom of the cavity 48 between the inner cylinder 46 and the outer cylinder 44. The IR sensor 52 is operable to receive and/or detect IR signals. It should be appreciated that while only one IR sensor 52 is shown, there may be multiple IR sensors 52 in like manner to the photo sensors 34 of FIG. 2.

As shown in FIG. 4, the IR sensor 52 is coupled to the controller 56. The IR sensor 52 provides a signal to the controller 56 that is used by the controller 52 to provide a signal to the autofocus control. The IR emitter 54 and IR sensor 52 may operate in several different modes. One mode requires the finger 58 of the user to reflect the IR signal from the IR emitter 54 to the IR sensor 52 as the finger 58 comes in proximity to the actuator 42. When a sufficient IR signal is received by the IR sensor 52 via reflection from the finger 58 (i.e. the finger 58 is within the "proximate" range), a signal is sent to the controller 56 to begin to autofocus. This assumes that the sensor 52 is set to a low sensitivity such that it does not normally detect the IR signal. In another mode, the IR sensor 52 is set to continuously receive an IR signal which, when cut off by the finger 58, triggers a signal to the controller 56 to begin autofocus. This assumes that the sensor 52 is normally receiving the IR signal. Preferably, the IR signal transmitted from the IR emitter 54 is coded to improve noise immunity. Such coding may be in the form of a modulated IR signal or an IR signal with an embedded code. Other manners of providing noise immunity and/or coding may be used.

In accordance with an aspect of the present invention, the light source/photo sensor technique of FIG. 2 and the IR emitter/sensor technique of FIG. 3 may be combined to yield a more accurate determination or detection of the proximity of a finger of a user to the actuator. As such, the circuitry/logic may be combined as depicted in FIG. 4.

Figure 5:
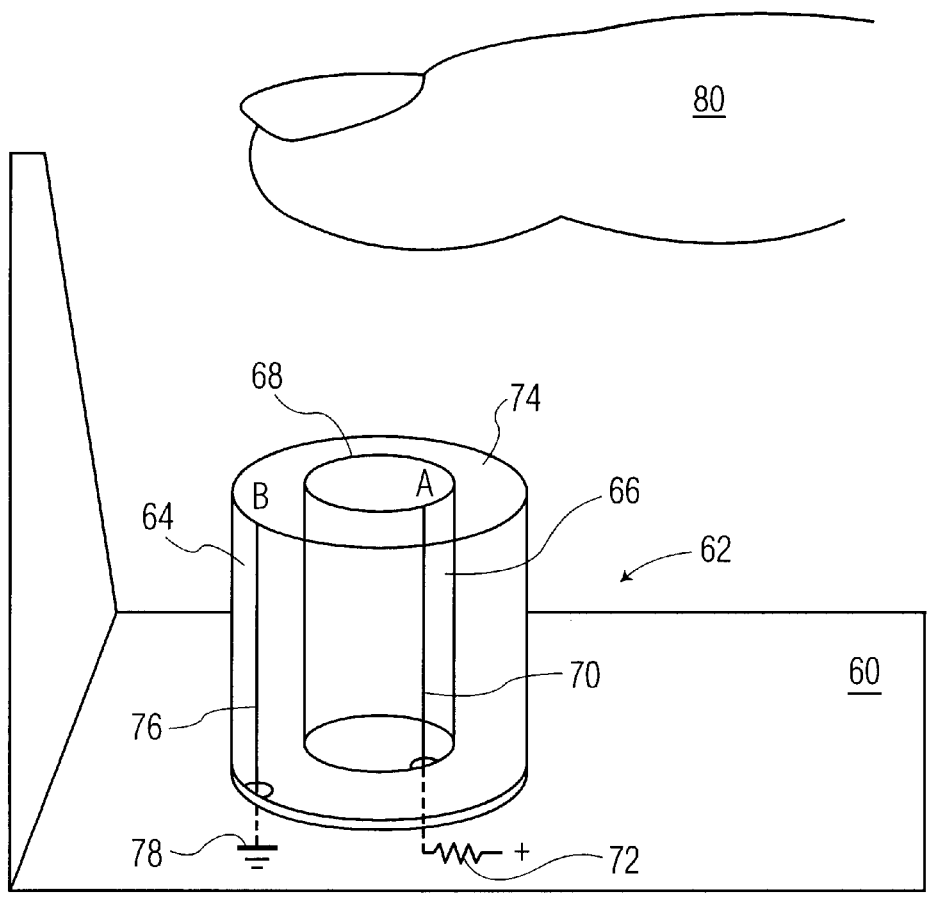
FIG. 5 is an enlarged perspective view of an actuator of a camera incorporating another embodiment of the present invention.

Referring now to FIG. 5, there is shown a further embodiment of the present invention. In particular, there is depicted an actuator 62 (e.g. a shutter/autofocus button) of a camera 60. It should be appreciated that only a portion of the housing of the camera 60 is shown. The actuator 62 is operable to be depressed by a user, represented in FIG. 5 by a user's finger 80, in order to take a picture. Preferably, the actuator 62 is normally biased into a non-depressed position as depicted in FIG. 5. The actuator 62 includes a first or outer cylinder or tube 64 and a second or inner cylinder or tube 66. The inner cylinder 66 is preferably, but not necessarily, coaxial and/or concentric with the outer cylinder 64. The outer and inner cylinders 44 and 46 are fabricated from a suitable material such as is known in the art.

In accordance with the embodiment of FIG. 5, the inner cylinder 66 has a conducting upper or top surface 68 that is connected at "A" via a conductor 70 to one end of a resistance 72, with the resistance 72 coupled at another end to a positive voltage, designated by the symbol "+". The conductor 70 is also coupled to one input of a comparator 84 (see FIG. 6) that is internal to the camera 60 (as is the resistor 72). The outer cylinder 64 likewise has a conducting top or upper surface 74 that is connected at "B" via a conductor 76 to ground 78. The two conducting surfaces 68 and 74 of the inner and outer cylinders 66 and 64 respectively, are insulated from each other by several megaohms of resistance. As the finger 80 touches the two conducting surfaces 68 and 74, the resistance between the two surfaces 68 and 74 changes (drops), signifying that the finger has been detected. A finger detection signal is then generated and acted upon appropriately.

Figure 6:
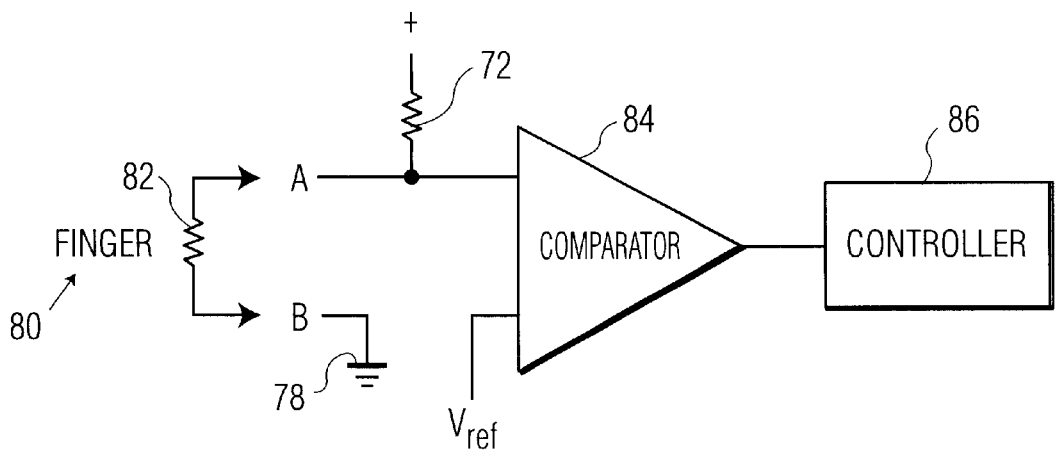
FIG. 6 is a schematic of exemplary circuitry/logic operable to implement the embodiment of the present invention depicted in FIG. 5.

Referring to FIG. 6, there is shown a circuit that may be used with the configuration/embodiment of FIG. 5. The conducting surface 68 of the inner cylinder 66 of FIG. 5 is designated by "A" while the conducting surface 74 of the outer cylinder 64 of FIG. 5 is designated by "B". "A" is coupled to one input of a comparator 84 while another input of the comparator 84 is coupled to a reference voltage Vref. An output of the comparator 84 is input to a controller 86. When the finger 80 touches the two conducting surfaces "A" and "B", a resistance (represented by the resistor 82) is now in the circuit causing a change in the input signal to the comparator 84. The input signal is compared to the reference voltage Vref by the comparator 84 which outputs a signal or not to the controller 86 in like manner to the operation of the circuit of FIG. 4. The change in resistance caused by the finger 80 contacting the two surfaces "A" and "B" creates a signal that is forwarded to the controller 86. The controller 86 controls the autofocus dependent upon the signal received (or not received) from the comparator 84.

Figure 7:
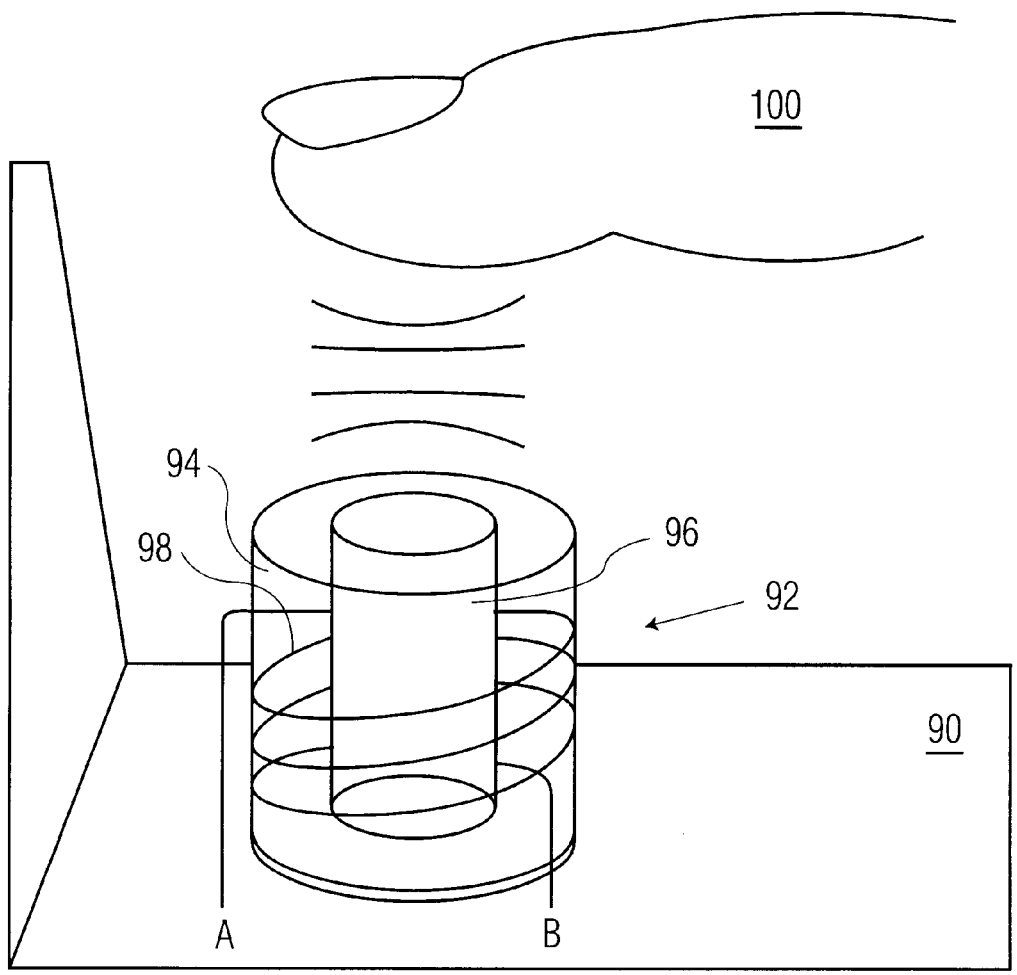
FIG. 7 is an enlarged perspective view of an actuator of a camera incorporating yet another embodiment of the present invention.

Referring now to FIG. 7, there is shown yet another embodiment of the present invention. In particular, there is depicted an actuator 92 (e.g. a shutter/autofocus button) of a camera 90. It should be appreciated that only a portion of the housing of the camera 90 is shown. The actuator 92 is operable to be depressed by a user, represented in FIG. 7 by a user's finger 100, in order to take a picture. Preferably, the actuator 92 is normally biased into a non-depressed position as depicted in FIG. 7. The actuator 92 includes a first or outer cylinder or tube 94 and a second or inner cylinder or tube 96. The inner cylinder 96 is preferably, but not necessarily, coaxial and/or concentric with the outer cylinder 94. The outer and inner cylinders 94 and 96 are fabricated from a suitable material such as is known in the art.

The inductor 98 may be wound on an inside surface of the outer cylinder 94, embedded into the outer cylinder 94, embedded into the inner cylinder 96, or wound on an outside surface of the cylinder 96. In all cases, proximity of the finger 100 to the inductor 98 changes its inductance by disturbing the magnetic field produced by the inductor 98. The change in inductance is detected and a corresponding signal is generated/produced. Variation in inductance may be used to indicate relative proximity. A threshold value may be used to trigger the autofocus feature/function of the camera 90.

Figure 8:
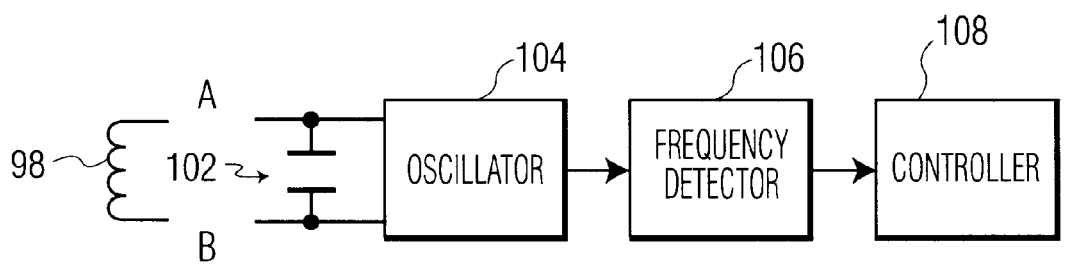
FIG. 8 is a schematic of exemplary circuitry/logic operable to implement the embodiment of the present invention depicted in FIG. 7.

Additionally referring to FIG. 8, the actuator 92 includes a coil or inductor 98 that is coupled internal to the camera 90 to a capacitor 102. The inductor 98 and the capacitor 102 are chosen to provide an oscillating circuit in conjunction oscillator circuitry 104. The coil/inductor 98 and the capacitor 102 form a tuned circuit. The values of the inductor 98 and the capacitor 102 are chosen accordingly. The oscillator 104 is coupled to a frequency detector 106 which is in turn coupled to a controller 108. When the frequency of the tuned circuit changes due to the proximity of the finger 100 to the coil 98, the frequency detector 106 detects the change in frequency and generates/produces a signal that is received by the controller 108. The change in frequency may need to be outside a threshold value before the controller 108 provides a signal to start the autofocus feature/function.

Figure 9:
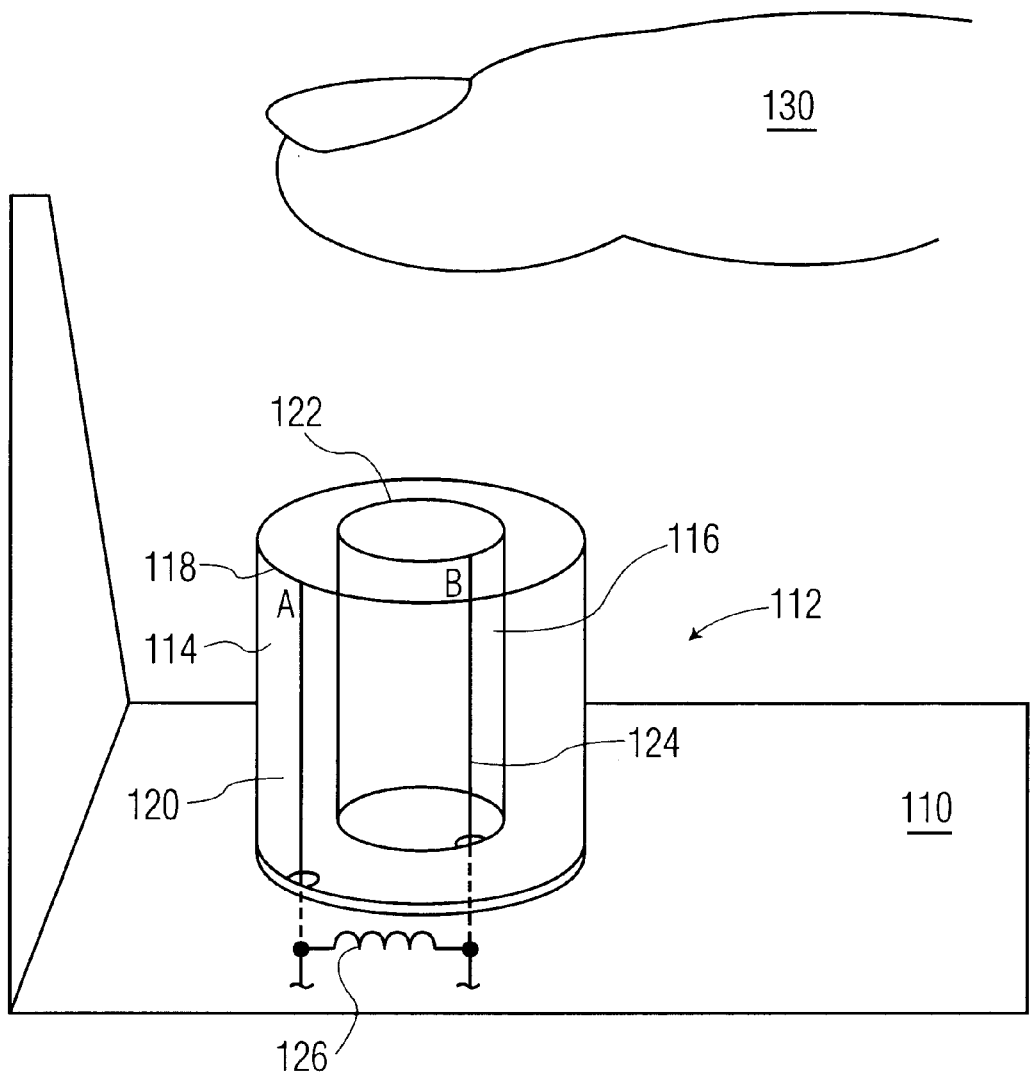
FIG. 9 is an enlarged perspective view of an actuator of a camera incorporating still another embodiment of the present invention.

Referring to FIG. 9, there is shown a still further embodiment of the present invention. In particular, there is depicted an actuator 112 (e.g. a shutter/autofocus button) of a camera 110. It should be appreciated that only a portion of the housing of the camera 110 is shown. The actuator 112 is operable to be depressed by a user, represented in FIG. 9 by a user's finger 130, in order to take a picture. Preferably, the actuator 112 is normally biased into a non-depressed position as depicted in FIG. 9. The actuator 112 includes a first or outer cylinder or tube 114 and a second or inner cylinder or tube 116. The inner cylinder 116 is preferably, but not necessarily, coaxial and/or concentric with the outer cylinder 114. The outer and inner cylinders 114 and 116 are fabricated from a suitable material such as is known in the art.

Figure 10:
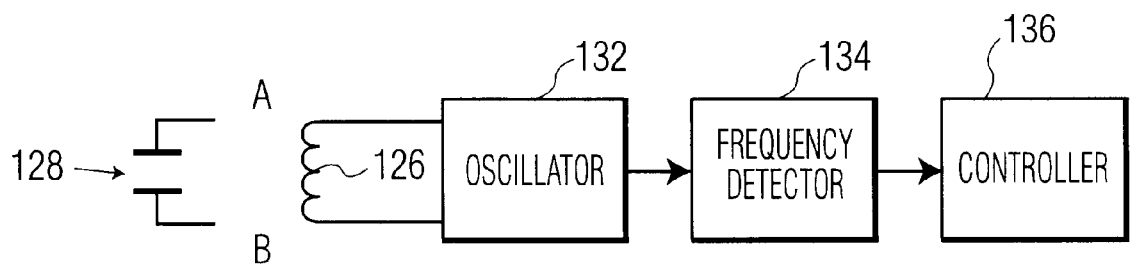
FIG. 10 is a schematic of exemplary circuitry/logic operable to implement the embodiment of the present invention depicted in FIG. 9.

The inner cylinder 116 has a conducting top surface 122. The outer cylinder 114 also has a conducting top surface 118. The conducting top surface 122 is insulated from the conducting top surface 118 such that a capacitance is formed between them. This capacitance along with a coil or inductor 126 forms a tuned circuit. Additionally referring to FIG. 10, the capacitance between the two top conducting surfaces 118 and 122 are represented by the capacitor 128. The capacitor 128 and the inductor 126 are coupled to an oscillator circuit 132 that is coupled to a frequency detector circuit 134 that is, in turn, coupled to a controller 136. Proximity of the finger 130 to the conducting surfaces 118 and 122 changes the capacitance therebetween. The change in capacitance creates a frequency change via the tuned circuit 128 and 126 that is detected by the frequency detector 134. The frequency detector detects the change in frequency, and when the change is outside a limit (threshold value) the frequency detector produces a signal for the controller 136 to begin the autofocus feature/function.

Figure 11:
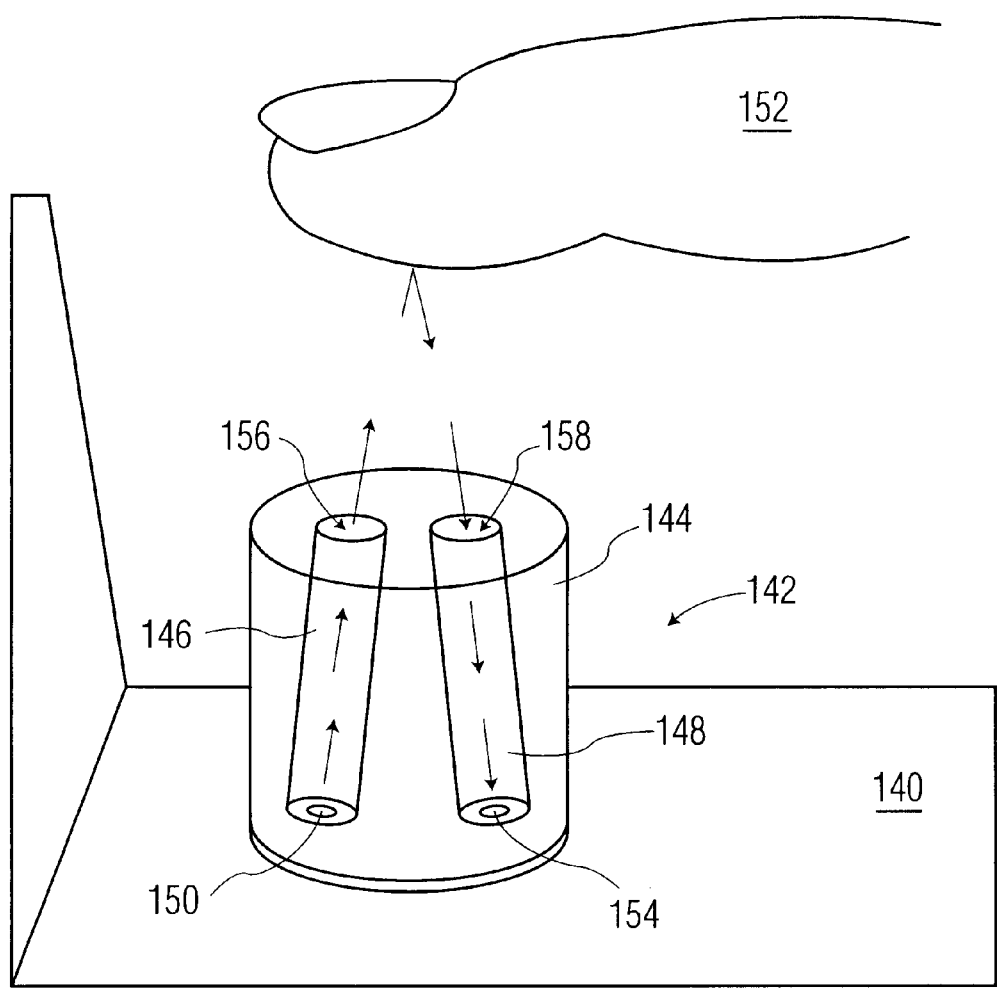
FIG. 11 is an enlarged perspective view of an actuator of a camera incorporating a yet further embodiment of the present invention.

Referring to FIG. 11, there is shown an additional embodiment of the present invention. In particular, there is depicted an actuator 142 (e.g. a shutter/autofocus button) of a camera 140. It should be appreciated that only a o portion of the housing of the camera 140 is shown. The actuator 142 is operable to be depressed by a user, represented in FIG. 11 by a user's finger 152, in order to take a picture. Preferably, the actuator 142 is normally biased into a non-depressed position as depicted in FIG. 11. The actuator 142 includes an outer cylinder or tube 144, a first inner cylinder of tube 146 and a second inner cylinder or tube 148. The first inner cylinder 146 is angled or skewed relative to a longitudinal axis of the outer cylinder 144. The second inner cylinder 148 is angled or skewed relative to the longitudinal axis of the outer cylinder 144. The first and second inner cylinders 146 and 148 are preferably angled the same degrees off of the longitudinal axis of the outer cylinder 144 but in an opposite direction such that respective longitudinal axes of the first and second inner cylinders 146 and 144 would eventually intersect when projected outwardly.

One of the first and second inner cylinders 146 and 148, here the first inner cylinder 146, includes a radiation source (emitter/transmitter) 150 that is operable to outwardly emit radiation. The other of the first and second inner cylinders 146 and 148, here the second inner cylinder 148 includes a radiation sensor or receiver that is operable to detect radiation from the radiation source 150 that has been reflected by a finger 152 of a user. As the finger 152 is move proximate the actuator 142, emitted radiation from the radiation source 150 (represented by arrows emanating from the first inner cylinder 146) is reflected from the finger 152 (represented by the angled arrow). The reflected 20 radiation is received (represented by arrows directed into the second inner cylinder 148) by the radiation sensor 154. The radiation sensor 154 is coupled to and functions in relatively the same manner as the embodiments of FIGS. 2–4. Angling of the inner cylinders 146 and 148 helps reduce extraneous light from impinging on the radiation sensor 154

Figure 12:
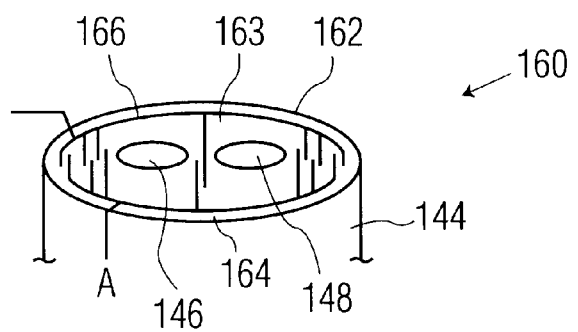
FIG. 12 is an enlarged partial perspective view of an actuator incorporating an even further embodiment of the present invention.

Referring to FIG. 12, an additional alternative embodiment, generally designated 160, is shown. In this embodiment, the outer cylinder 144 includes a first electrical grid 164 and a second electrical grid 166 on a top surface 163 of the outer cylinder 144. The grids 164 and 166 may be coupled to a circuit such as those shown herein, or may strictly be a switch that closes when the top surface is touched by a user's finger. In any case, when a user's finger is either proximate to or on the grids 164, 166, the circuitry detects the proximate location of the finger and provides a signal to begin the autofocus feature/function.

It should additionally be appreciated that it is assumed that autofocus is caused or initiated by a user's finger being on or near (proximate) the shutter control of the camera, as this is the manner in which the autofocus feature is commonly implemented in cameras. A major advantage of successfully detecting when to perform autofocus is that the controller of the camera also knows when to stop autofocusing. Autofocusing may be performed as long as the user's finger is detected, or for a timed interval or period after a user's finger is to removed from the detection zone.

It should be further appreciated that some or all of the above embodiments may not operate perfectly under all possible conditions. Such perfect operation under all conditions may be thought of as 100% accuracy. However, it should be appreciated that several of the techniques presented herein can be used simultaneously to help increase accuracy and thus achieve perfect operation.

Other applications for the present invention may include inputs to a control panel of a camera. Such proximity buttons implemented on a camera might replace conventional buttons used to: bring up menus, select from menus, show battery life, and other camera related functions and/or features. As well, the present invention may be implemented in military applications such as: sensors on triggers to enable firing, activation of night vision gear, and the like.

While this invention has been described as having a preferred design and/or configuration, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electronic apparatus comprising:
 a processing unit;
 an actuator in communication with said processing unit and operable upon actuation thereof to activate a first function of the electronic apparatus; and
 a proximity detector associated with said actuator and in communication with said processing unit, said proximity detector operable to detect when a finger of a user is proximate said actuator and initiate a second function of the electronic apparatus.

2. The electronic apparatus of claim 1, wherein said proximity detector comprises:

a light source operable to emit light;

a photo sensor operable to receive light emitted from said light source and reflected from the finger of the user; and a comparator in communication with said photo sensor and said processing unit, said comparator operable to provide a threshold level of detection of the finger proximate said actuator in order to initiate the second function of the electronic apparatus.

3. The electronic apparatus of claim 2, wherein said proximity detector further comprises a plurality of photo sensors each in communication with a comparator.

4. The electronic apparatus of claim 1, wherein said proximity detector comprises:

an infrared emitter in communication with said processing unit and operable to emit infrared radiation; and an infrared sensor in communication with said processing unit and operable to detect when a finger of a user is proximate said actuator and initiate a second function of the electronic apparatus.

5. The electronic apparatus of claim 1, wherein said proximity detector comprises:

a tuned circuit; and a frequency detector in communication with said tuned circuit and said processing unit.

6. A camera comprising:

a controller;

a shutter button in communication with said controller and operable to activate a shutter of the camera; and a proximity detector associated with said shutter button and in communication with said controller, said proximity detector operable to sense when a finger of a user is proximate the shutter button in order to initiate an autofocus feature.

7. The camera of claim 6, wherein said proximity detector comprises:

a light source operable to emit light;

a photo sensor operable to receive light emitted from said light source and reflected from the finger of the user; and a comparator in communication with said photo sensor and said controller, said comparator operable to provide a selectable threshold level of detection of the finger at varying distances proximate said actuator in order to initiate the second function of the electronic apparatus.

8. The camera of claim 7, wherein said light source is a LED.

9. The electronic apparatus of claim 6, wherein said proximity detector further comprises a plurality of photo sensors each in communication with a comparator.

10. The electronic apparatus of claim 6, wherein said proximity detector comprises:

an infrared emitter in communication with said controller and operable to emit infrared radiation; and an infrared sensor in communication with said controller and operable to detect when a finger of a user is proximate said actuator and initiate a second function of the electronic apparatus.

11. The electronic apparatus of claim 6, wherein said proximity detector comprises:

a tuned circuit; and a frequency detector in communication with said tuned circuit and said controller.

12. A camera comprising:

a controller;

an actuator in communication with said controller and operable to initiate a first function of the camera;

means for detecting when a finger of a user is proximate said actuator; and means for initiating an autofocus feature of the camera when the finger of the user is detected in proximity to said actuator.

13. The camera of claim 12, wherein said means for detecting comprises:

a light source operable to emit light;

a photo sensor operable to receive light emitted from said light source and reflected from the finger of the user; and a comparator in communication with said photo sensor and said controller, said comparator operable to provide a selectable threshold level of detection of the finger at varying distances proximate said actuator.

14. The camera of claim 13, wherein said means for detecting further comprises a plurality of photo sensors each in communication with a comparator.

15. The camera of claim 12, wherein said means for detecting comprises:

an infrared emitter in communication with said controller and operable to emit infrared radiation; and an infrared sensor in communication with said controller and operable to detect when a finger of a user is proximate said actuator.

16. The camera of claim 12, wherein said means for detecting comprises:

a tuned circuit; and a frequency detector in communication with said tuned circuit and said controller.

17. The camera of claim 16, wherein said tuned circuit includes an inductance and a capacitance.

* * * * *